United States Patent [19]

Stepp

[11] Patent Number: 4,991,015
[45] Date of Patent: Feb. 5, 1991

[54] METHOD AND CIRCUIT ARRANGEMENT FOR IDENTIFYING THE PRESENCE OR ABSENCE OF AT LEAST ONE FREQUENCY OF A KNOWN VALUE IN AN INPUT SIGNAL COMPOUND OF A PLURALITY OF FREQUENCIES

[75] Inventor: Richard Stepp, Munich, Fed. Rep. of Germany

[73] Assignee: Siemens Aktiengesellschaft, Berlin and Munich, Fed. Rep. of Germany

[21] Appl. No.: 548,202

[22] Filed: Jul. 5, 1990

Related U.S. Application Data

[63] Continuation of Ser. No. 399,976, Aug. 29, 1989, abandoned.

[30] Foreign Application Priority Data

Aug. 31, 1988 [EP] European Pat. Off. ............ 88114224

[51] Int. Cl.$^5$ .................. H04N 5/60; H04N 7/04; G01R 23/16; H04B 1/16
[52] U.S. Cl. ........................ 358/198; 358/196; 358/144; 324/77 B; 324/79 R; 381/2; 381/7; 455/132; 455/137; 455/214
[58] Field of Search ............... 358/143, 198, 196, 144; 324/77 B, 79 R; 381/2, 7, 12, 13, 15; 455/132–137, 214

[56] References Cited

U.S. PATENT DOCUMENTS

| | | | |
|---|---|---|---|
| 3,697,878 | 10/1972 | Georgescu | 324/77 B |
| 3,783,413 | 1/1974 | Froment et al. | 324/77 B |
| 4,139,866 | 2/1979 | Wegner | 358/198 |
| 4,281,411 | 7/1981 | Bonn et al. | 455/137 |
| 4,571,622 | 2/1986 | Davidov et al. | 358/198 |
| 4,591,915 | 5/1986 | Davidov et al. | 358/198 |
| 4,668,910 | 5/1987 | Stepp | 324/77 B |
| 4,710,814 | 12/1987 | Gassmann et al. | 358/143 |
| 4,827,515 | 5/1989 | Reich . | |

FOREIGN PATENT DOCUMENTS

0146749 7/1985 European Pat. Off. .

OTHER PUBLICATIONS

Publication "Transmission of Two or More Sound Programmes or Information Channels in Television", Report 795-1, CCIR Documents, pp. 205–213, (1978–1982).

Article Kummel entitled "Zwei-Kanal-Fernsehton", publication Funckschau, No. 2, pp. 76–79, Jan. 1982.

*Primary Examiner*—John W. Shepperd
*Assistant Examiner*—Michael D. Parker
*Attorney, Agent, or Firm*—Hill, Van Santen, Steadman & Simpson

[57] ABSTRACT

A method and circuit arrangement identifies the presence or absence of known frequencies in an input signal composed of a plurality of frequencies, whereby a frequency generator controlled by a reference frequency generates four switch signals having frequencies dependent upon the frequency to be identified and having a phase difference of 90° and respectively one switch signal is mixed with the input signal in a respective mixer. The respective mixer products of two mixers are additively combined and are filtered through a respective filter for filtering AC components out, and the DC voltage component contained in the respective mixer product given the presence of the known frequency is evaluated with respect to the amplitude.

10 Claims, 6 Drawing Sheets

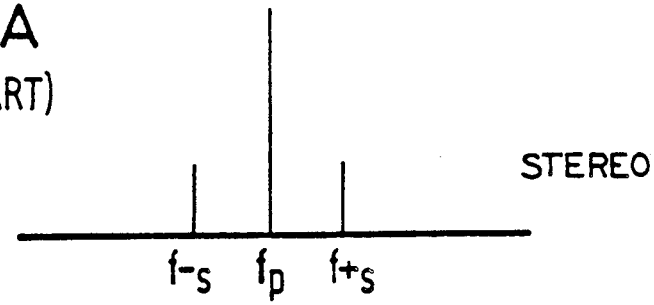
FIG 1A
(PRIOR ART)
STEREO
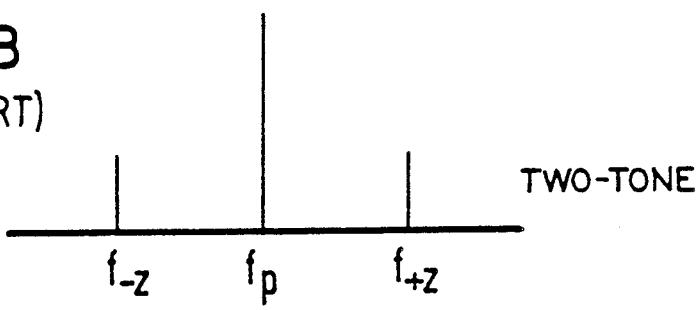
FIG 1B
(PRIOR ART)
TWO-TONE
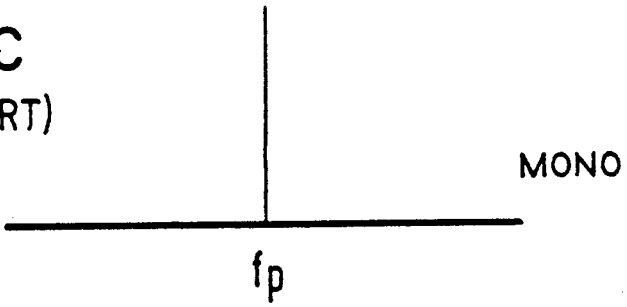
FIG 1C
(PRIOR ART)
MONO
FIG 1D
(PRIOR ART)
MONO $|X| \vee |Y| > S$ $\sqrt{X^2 + Y^2} > S$

METHOD AND CIRCUIT ARRANGEMENT FOR IDENTIFYING THE PRESENCE OR ABSENCE OF AT LEAST ONE FREQUENCY OF A KNOWN VALUE IN AN INPUT SIGNAL COMPOUND OF A PLURALITY OF FREQUENCIES

This is a continuation of application Ser. No. 399,976, filed Aug. 29, 1989, now abandoned.

BACKGROUND OF THE INVENTION

1. Field of the Invention

The present invention is directed generally to a method for identifying the presence or absence of a known frequency in an input signal composed of a plurality of frequencies, and in particular to a method supplying an input signal to one signal input of each of a plurality of mixers and supplying a further input signal derived from a stable reference frequency to the remaining signal inputs of the mixers wherein the outputs of the mixers are filtered and amplitude evaluated.

2. Description of the Related Art

An example of the need for identifying the presence or absence of defined frequencies having a known value in an input signal composed of a plurality of frequencies is the decoding and recognition of program type information in a two-carrier television audio system. A two-carrier television audio system is described in some detail in the publication entitled "Transmission of Two or More Sound Programmes or Information Channels in Television,"Report 795-1, CCIR Documents, pages 205–213 (1978-1982). In accordance with that disclosure, the program type recognition in the two-carrier television audio system occurs with the assistance of an amplitude-modulated pilot carrier tone. The frequency of the pilot carrier tone is equal to 3.5 times the video line frequency $f_h$. An identifying tone is modulated onto the pilot carrier tone for the stereo and duel two channels, or tone, operating modes. The frequency spectrums for the possible operating modes are shown in FIGS. 1A, 1B, 1C and 1D.

FIG. 1A shows a frequency spectrum for a stereo operating mode in which a pilot carrier tone having a frequency $f_p$ and that is equal to $3.5 \times 15,625$ Hz as an identifying tone at a frequency of 15,625/133 Hz modulated onto it by amplitude modulation. The video line frequency $f_h$ thus has a value of 15,625 Hz. In FIG. 1A the side-bands for the stereo signals are identified as $f_{\times s}$ and $f_{-s}$.

In FIG. 1B is shown a frequency spectrum for a two tone, or two channel, operating mode, such as SAP mode, wherein an identifying tone having a frequency of 15,625/57 Hz is modulated onto the pilot carrier tone having a frequency of $f_p$. In this case, the side-bands are referenced $f_{\times z}$ and $f_{-z}$.

FIG. 1C shows a mono operating mode in a two-carrier television audio system wherein only the pilot carrier-tone having a frequency of $f_p$ is present on which no identifying tone is modulated.

Finally, FIG. 1D shows a standard mono operating mode in the previously standard television transmission mode wherein no pilot carrier tone is present.

The degree of modulation in the operating modes shown in FIGS. 1A and 1B amounts to 50%.

A transmission of the amplitude of the modulation frequencies set forth above ensues with a television transmission signal such that the amplitude modulated pilot carrier tone is modulated onto a carrier in the MHz domain with frequency modulation. In the television receiver, the frequency demodulation is first carried out and this is followed by an amplitude demodulation to acquire the identifying tones. The interpretation of the mono operating mode, the two channel operating mode, and the stereo operating mode can occur via the upper or lower sideband. The interpretation is thereby equivalent.

Up to now, the decoding of the program recognition in two-carrier television audio systems is usually carried out by sync or envelope rectification of the modulated pilot carrier tone with a subsequent interpretation of the demodulated identified tones.

In the transmission of television information, any unwanted frequencies that are identical to the frequency of the pilot carrier tone can arise from the video part of the television information as the result of cross-modulation effects. These unwanted frequencies can be so strong that corresponding pronounced fluctuations of the amplitude of the pilot carrier tone and, thus, undesired, unwanted frequencies appear after the amplitude demodulation.

In the publication by Kuemmel, "Zwei-Kama;-Funkschau", No. 2 76–79, (January 1982), is disclosed an automatically switchable stereo-dual tone decoder provided for a two-carrier television audio system, the switching information needed for the identification of the operating mode is acquired through the use of two identical phase locked loop circuits that are tuned to the respective identifier frequency by a potentiometer.

In European published patent application EP-OS No. 0 146 749 is disclosed a circuit arrangement operating according to a different principle.

FIG. 2 shows a block circuit diagram for a circuit arrangement of the prior art which is taken from the European published application No. 0 146 749;

FIG. 3 shows a block circuit diagram of an embodiment of a frequency generator which is provided in the circuit arrangement of FIG. 2; and FIGS. 4A and 4B are diagrams for explaining the interpretation of dc voltage parts corresponding to a frequency to be recognized.

In the circuit arrangement of FIG. 2, an input signal is supplied to an input 20. The presence or absence of a frequency of a known value in the input signal is to be determined. For the sake of simplicity, let the input signal be represented by:

A sin (Omega t+fi),

Wherein A denotes the amplitude of the signal, Omega denotes its frequency, t denotes the time, and fi denotes the phase of the input signal.

Two switch signals having a frequency identical to the frequency to be identified, also referred to as the frequency of interest, and having a phase difference of 90° are generated by a frequency generator 21 from a stable reference frequency which is supplied to an input 22. In the case of a two-carrier television audio system, it is expedient to use the video line frequency $f_h$, which is available in the video signal, as the stable reference frequency.

The input signal at the input 20 is supplied to one input of each of two liner mixers 25 and 26. One of the two switch signals generated by the frequency generator is supplied to a further input of the mixer 25 via a line 23 while the other of the two switch signals generated by the frequency generator 21 is supplied to the other mixer 26 via a line 24. A multiplicative mixing of the input signal with the respective switch signals ensues in the mixers 25 and 26. When the frequencies of the input signal and of the two switch signals are identical, then the outputs of the mixers 25 and 26 still only supply a dc voltage component X or Y, respectively, that is proportional to the amplitude A and the phase angle fi of the input signal. Therefore, the following approximations are valid.

$$X = A \sin fi$$

$$Y = A \cos fi$$

As may be seen, the input signal is evaluated in two channels with a phase difference of 90° between the switch signals supplied to the mixers 25 and 26, since the phase fi of the input signal may be arbitrary, i.e. may be either 0° or 90°, or a multiple thereof by a factor of 180°. Thus, the dc voltage part according to the two equations recited above may disappear given evaluation in one channel.

The two mixers 25 and 26 are each followed by a filter in the form of low-pass filters 27 and 28 that serve the purpose of filtering out ac components from the output signals of the respective mixers 25 and 26. Each of the low-pass filters 27 and 28 has a cut-off frequency of a few Hz, and preferably at most two Hz. With respect to the input signal at input 20, the low-pass filters 27 and 28 act like a band pass filter having a center frequency equal to the switching frequency of the two switch signals appearing on lines 23 and 24 and having a band width equal to twice the cut-off frequency of the low-pass filters 27 and 28. Only the dc voltage components X and Y therefore appear at the outputs of the low-pass filters 27 and 28 given identity of the frequency of the signal at the input 20 and of the switch signals on the lines 23 and 24.

The output signals from the low-pass filters 27 and 28 are each supplied to a corresponding amplitude evaluator 29 and 30 with which the amplitude of the dc voltage component X or Y is evaluated. An interpretation of the amplitude suffices for identifying the presence or non-presence, i.e. absence, of a frequency of a known-value in the input signal at the input 20 since the phase fi of the input signal is arbitrary.

The amplitude evaluation can ensue in various ways. For example, the amplitude evaluators 29 and 30 can be formed as threshold switches each having a threshold input 33 and 34 that identify whether the absolute values of the dc voltage components X and Y are higher than a prescribed threshold value S which is fed to the threshold inputs 33 and 34. This type of amplitude evaluation is shown in FIG. 4A. The dc voltage component is thereby in turn established by an amplitude and by a resultant angle so that the dc voltage component is formed by a phaser, or indicator, 50 that lies on a circle 51 depending upon the arbitrary angle Φ of the signal. The amplitude evaluators 29 and 30 of FIG. 2 which are formed as threshold switches respond to a threshold S which results in a square 52 having an edge length corresponding to twice the threshold of the threshold switches 29 and 30 for evaluation of the dc voltage component having an amplitude A and a resultant angle Φ. When the indicator 50 for the dc voltage component corresponding to the amplitude A lies outside the square 52 defined by the threshold S, then the dc voltage component is output at the outputs 31 and 32 of the amplitude evaluators 29 and 30 of FIG. 2, which establishes that the presence of the frequency to be identified has been measured in the input signal at the input 20.

A further possibility for evaluating the dc voltage components X and Y is by way of calculating the square root of the sum of the squares with conventional electronic elements and identifying whether the value of this root is greater than a prescribed threshold value S. This situation is shown in FIG. 4B, in which similar elements are given identical reference numbers. An evaluator circle 54 is present instead of the evaluator square 52 of FIG. 4A because the square root of the sum of the squares having the values X and Y traces out a circle. As above, the presence of a dc component lying outside the evaluator circle 54 results in the dc voltage component appearing at the outputs of the evaluator circuits. Of course, in this embodiment, the threshold inputs pf the evaluator circuits have the parameters for the evaluator circle of radius S in place of the angle constant values of the example in FIG. 4A.

FIG. 3 shows an embodiment of a frequency generator 21 in the form of a phase locked loop (PLL) circuit for generating a switch signals for the mixers 25 and 26 in FIG. 2. A voltage-controlled oscillator (VCO) 40 oscillates at the frequency of the switch signal for the mixers 25 and 26. The output signal of the oscillator 40 is output on a line 41. A stable reference frequency which is supplied into the input 22 of FIG. 2 is supplied to the corresponding input 42 in the circuit of FIG. 3. For frequency matching, a frequency divider 43 follows the input 42 and a frequency divider 44 follows the voltage-controlled oscillator 40. The output signals from the frequency dividers 43 and 44 are compared to one another in a phase comparison stage 45. The output signal from the phase comparison stage 45 is supplied to the voltage controlled oscillator 40 through a low-pass filter 46, which results in frequency control of the oscillator 40.

For generating the two switch signals appearing on lines 23 and 24 for the mixers 25 and 26, the switch signals are phase-shifted by 90° to one another. The output line 41 of the phased locked loop circuit of FIG. 3 is divided at a phase-shifter 47 which shifts the output signal by 90° in one of the two divided output lines 23 and 24. Such a phase-shifter circuit 47 is inherently conventional, and since it is not part of the phase-locked loop circuit, it is shown in FIG. 3 in dotted outline.

In the specific case of two-carrier television audio system in the PAL system, the frequency divider 43 divides the horizontal sweep frequency $f_h$ of 15,625 Hz by 133 in the case of the stereo operating mode and by 57 in the case of a two channel, i.e. SAP, operating mode. For stereo operation, the frequency of the upper sideband $f_{+s}$ to be detected thus derives as $$f_{+s} = 7/2\, f_h + f_h/133 \text{ or}$$

$$f_{+s} = 933/266\, f_h.$$

Given the horizontal scan frequency $f_h/133$, the identifier tone in the stereo operating mode lies at 117 Hz. Phase differences between the output signal of the frequency divider 43 and the output signal of the frequency divider 44 lead to control spikes at the output of the phase comparison stage 45. When the cut-off frequency of the low-pass filter 46 used as the control filter is not low enough or when its attenuation at 117 Hz does not lie on the order of magnitude of 30–40 dB, a frequency modulation at the oscillator 40 is obtained on the basis of these control spikes with sidebands that correspond to a present stereo signal, even if no pilot tone is present. The phase locked loop circuit of FIG. 3 becomes extremely sluggish due to a low-off frequency for the low-pass filter 46 corresponding to the requirements and due to a correspondingly small loop band width. Appropriate dimensioning of the phase locked loop circuit is extremely critical and the leakage currents in its control loop dare not lie in the nano amp range.

Due to a correspondingly slow frequency editing circuit, however, the overall circuit arrangement as disclosed in European published application No. 0 146 749 becomes extremely sluggish. This loop band width allows an admissable deviation in the horizontal frequency in the order of magnitude of only about 1Hz. For example, in video tape recordings, a greater horizontal frequency deviation can arise as a consequence of synchronization fluctuations in the recording or the playback means, so that an undisturbed detection of the spectral line of a characteristic frequency of the audio modes is not possible with such known circuit arrangements.

SUMMARY OF THE INVENTION

An object of the present invention is to provide for a faster identification of the presence or absence of frequencies having a known value, and particularly for identifying tones in a two-carrier television audio system, whereby carrier disturbances play no part.

In a method for identifying the presence or absence of a frequency of known value, the input signals are supplied to one input of each of four mixers and the output signals from pairs of the mixers are additively combined, the mixers being respectively supplied with four switch signals having a frequency which is identical to the frequency to be identified and being derived from a reference frequency. A fixed phase relationship exists between the four switch signals which is such that the signal components of an undesired sideband which may be present are suppressed by the additive operation of the output signals of the two mixers and the signal components having the frequency to be identified are increased by the superimposition of the two mixer output signals. The basic components of the two output signals after the summation have a phase angle of 90° relative to one another.

A circuit arrangement for implementing the method of the present invention provides a frequency generator driven by a stable reference frequency for generating the switch signals on switch signal outputs and by four mixers each having one input coupled to the switch signal outputs of the frequency generators and each having second inputs for the input signal in which the presence or absence of at least one frequency having a known value is to be identified. Two addition, or summation, circuits each having two inputs and an output are coupled with respective ones of the inputs of each addition circuit connected to the outputs of two mixers. A filter is connected to the output of each addition circuit for filtering out ac components in the signals, and amplitude evaluation units are coupled to the outputs of the respective filters.

Advantageous modifications of the invention are provided wherein the method is for identification of identifier frequencies modulated onto a pilot tone carrier in a two-carrier television audio system wherein the video line frequency is used as the reference frequency. The switch signals in the form of amplitude modulated signals are generated from the video line frequency and the carrier frequency of these switch signals corresponds to the pilot tone frequency and the frequency of modulation corresponds to the identifier frequency to be identified.

A further improvement wherein the filtering step is carried out with a low-pass filter. The amplitude evaluation step ensues in one embodiment with the absolute values of the dc voltage components contained in the respective output signals being subjected to a threshold determination to determine the presence or absence of a frequency of known value. Alternately, the amplitude evaluation ensues by a value of the square root of the sum of the squares of the absolute values of the dc voltage components of the output signals being subjected to a threshold determination to determine the presence or absence of the frequency of known value.

It is possible to apply the present invention in the identification of a plurality of frequencies having known values in parallel channels in which the switch signals have the frequency of a frequency to be identified. The identification of a plurality of frequencies may also ensue by a multiplex mode of operation by switching the switch signals to the frequency to be identified.

Preferred developments of the circuit arrangement include forming the frequency generator as a phase locked loop circuit. The phase locked loop circuit of the frequency generator preferably has four signal outputs where two of the signal outputs carry signals of the same frequency having a different phase relation. The signal outputs are connected to the signal inputs of logic gates and the outputs of the logic gates form the outputs of the frequency generator.

BRIEF DESCRIPTION OF THE DRAWINGS

FIGS. 1A-4B are discussed above regarding prior art techniques.

DESCRIPTION OF THE PREFERRED EMBODIMENTS

Figure 2:
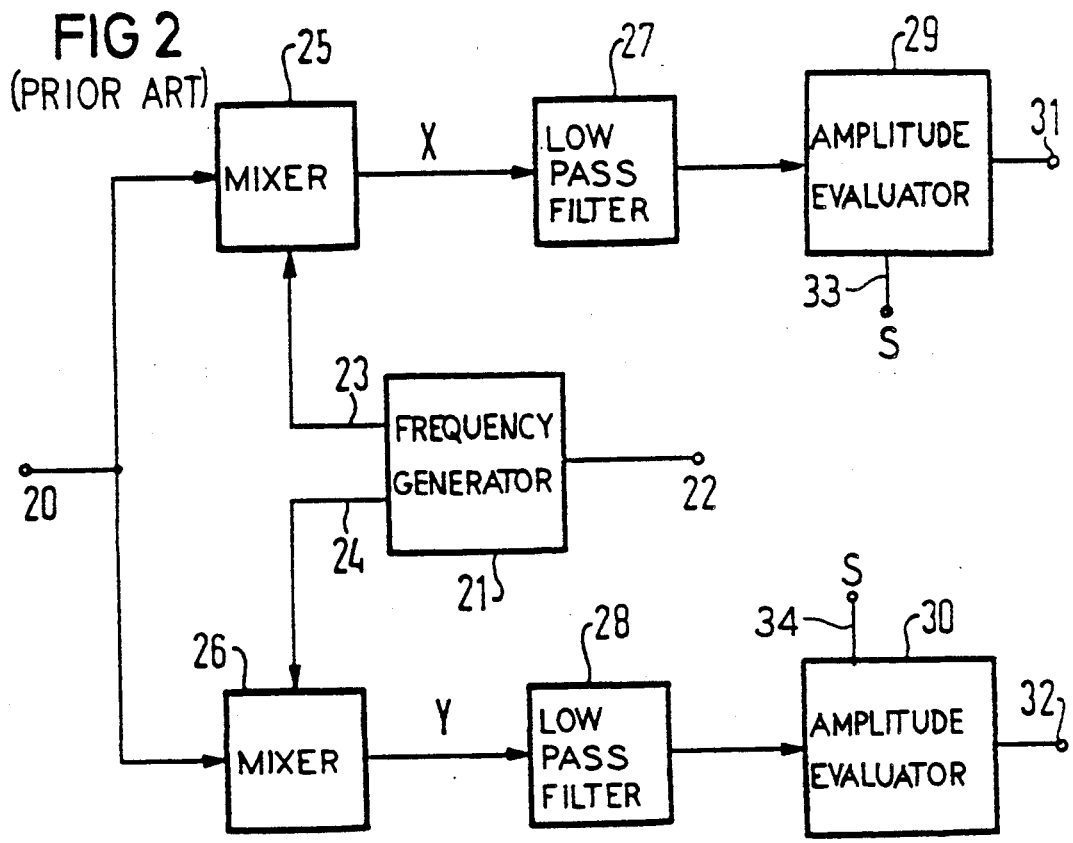
Figure 3:
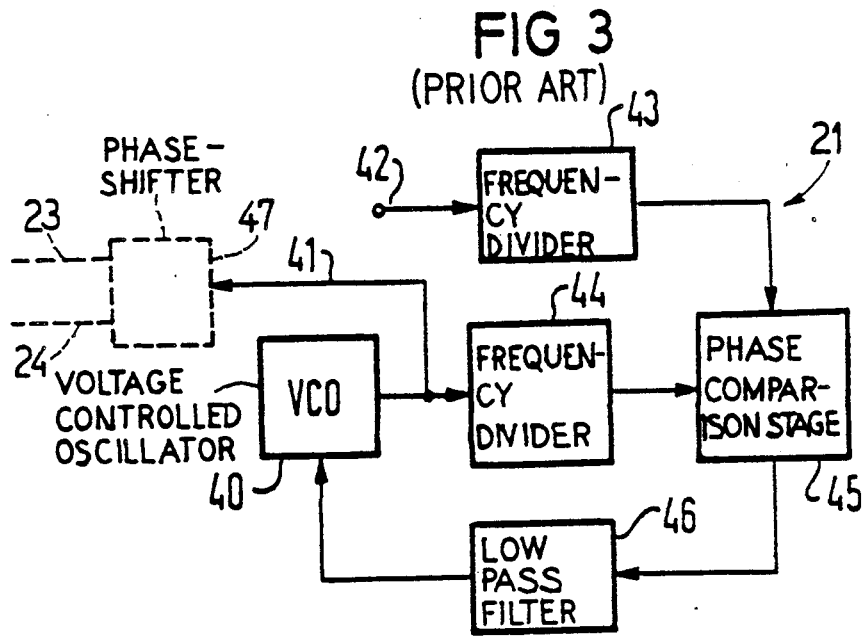
Figure 4A:
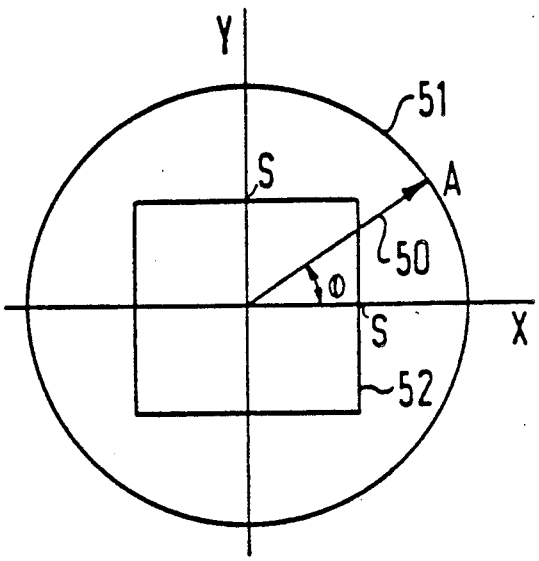
Figure 4B:
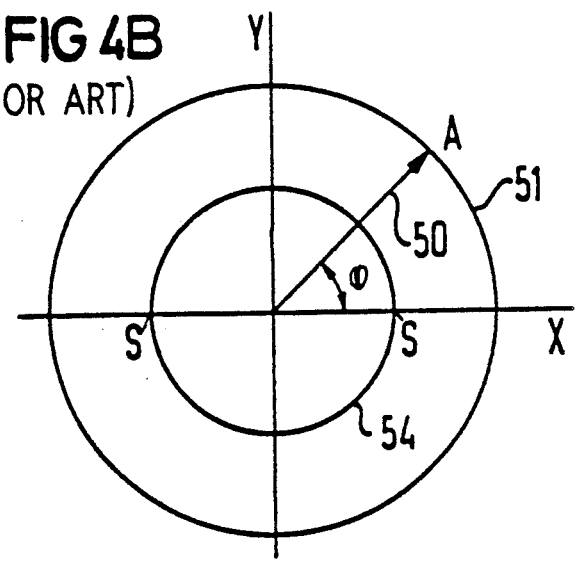
Figure 5:
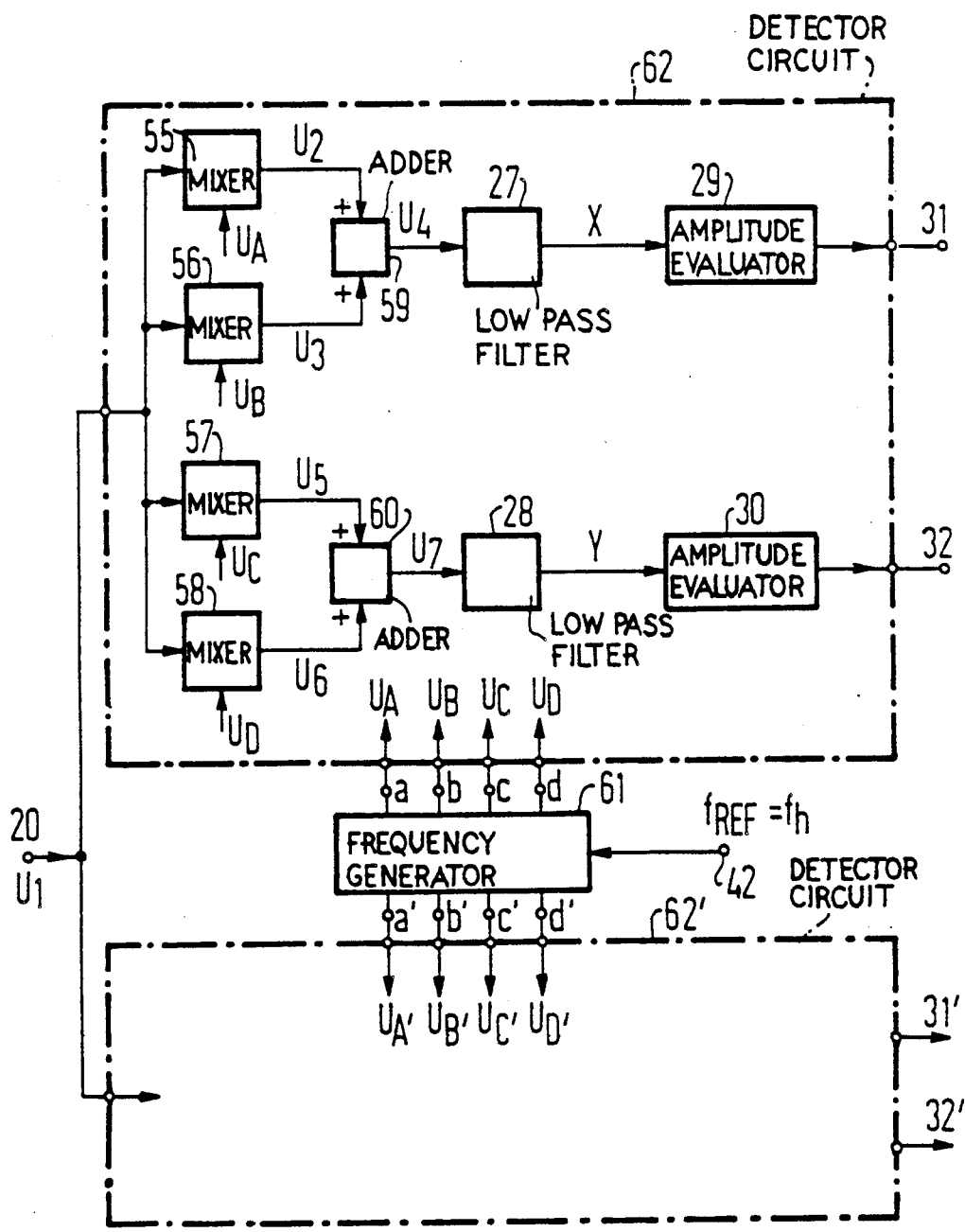
FIG. 5 is a block circuit diagram of a possible circuit arrangement for implementing the methods of the present invention, which may also be used in the specific case of simultaneous identification of two different frequencies upon the use of two detector circuits having identical structure.

In FIG. 5 is shown two blocks 62 and 62', each of which is intended to hold an identical detector circuit. The detector circuit 62 is shown in greater detail with regard to the circuit blocks and functions than the identical detector circuit 62'. In the detector circuit 62 is contained four mixers 55, 56, 57 and 58 each having a linear transient response where one input of each mixer is connected to a signal input lead 20 for the overall circuit. The four mixers 55-58 may be, for example, a quad multiplier, or four part multiplier.

The signal input lead 20 is charged with an input signal $U_1$ and the purpose of the overall circuit is to identify whether the input signal $U_1$ contains a frequency having a defined value. In a two-carrier television audio system, the signal $U_1$, for example, contains a pilot tone signal having a radiant pilot tone frequency omega$_p$ that, as needed, is amplitude modulated with a radian frequency omega$_s$ for the stereo identification signal or with a radian frequency Omega$_z$ for a dual tone identification signal. Specifically for the stereo identification signal, the input signal $U_1$ of the detector circuit may have the following form:

$$U_1 = A(1+m \cos(\text{omega}_s\, t + \text{psi})) \cos(\text{omega}_p\, t + fi)$$

| wherein | A | = Amplitude of the pilot tone frequency, |
|---|---|---|
| | m | = Modulation degree, m typically is 0.5 here, |
| | omega$_p$ | = Radian pilot tone frequency, |
| | omega$_s$ | = Radian frequency of the stereo identification |
| signal, | | |
| | fi | = Arbitrary pilot tone phase, |
| | psi | = Arbitrary identification signal phase. |

The further signal input of the mixer 55 is connected to the a signal output a, the further signal input of the mixer 56 is connected to the signal output b, the further signal input of the mixer 57 is connected to the signal output c and the further signal input of the mixer 58 is connected to the signal output d of a frequency generator 61 which generates switch signals $U_A$, $U_B$, $U_C$ and $U_D$ for the detector 62 at the signal outputs a, b, c, and d. When present, the frequency generator 61 also provides switch signals $U_{A'}$, $U_{B'}$, $U_{C'}$, and $U_{D'}$ for the detector 62' at further signal outputs a', b', c', and d'. The video line frequency $f_h$ of 15,625 Hz that is available in the video signal expediently serves as the reference frequency $f_{REF}$ for the frequency generator 61 in a television two-channel audio system. In general, however, every other suitable stable frequency that is produced by a crystal oscillator, for example, may be used as a reference frequency $f_{REF}$.

A multiplicative mixing of the input signal $U_1$ with the respective switch signals $U_A$, $U_B$, $U_C$, and $U_D$ ensues in the respective mixers 55, 56, 57, and 58. DC voltage components which are proportional to the amplitudes and the phase angles of the respective input signals are generated at the outputs of the individual linear mixers 55-58 only for input signal components whose frequencies are exactly identical to the frequencies contained in the switch signals $U_A$ through $U_D$. All other input signal components generate ac voltages.

A signal output $U_2$ of the mixer 55 and that of the mixer 56 is connected to respective signal inputs of an adder circuit 59. A signal output $U_5$ of the mixer 57 and that of the mixer 58 is connected to respective signal inputs of a further adder circuit 60. The output signal $U_2$ of the mixer 55 and an output signal $U_3$ of the mixer 56 lead to an output signal $U_4$ equals $U_2$ plus $u_3$ from the adder circuit 59, and the output signal $U_5$ of the mixer 57 and an output signal $U_6$ of the mixer 58 lead to an output signal $U_7$ equals $U_5$ plus $U_6$ from the adder circuit 60. In accordance with the invention, the switch signals $U_A$, $U_B$, $U_C$ and $U_D$ must be selected in terms of frequency and phase so that the signals $U_4$ and $U_7$ differ only on the basis of a phase difference of 90°.

The adder circuits 59 and 60 may be arbitrarily constructed of any known means. Given the use of a standard quad mixer, in particular, it is adequate to connect the two output signal leads together and to identify the mixer output signal a formed by the difference of the overall currents deriving therefrom. Each of the signal outputs of the two adder circuits 59 and 60 is followed by a low-pass filter 27 and 28. In this way, the circuit is analogous to that described in the prior art since the low-pass filter suppresses the AC components of these signals. An output signal X from the low-pass filter 27 is evaluated in a first amplitude evaluator 29 and the output of the amplitude evaluator 29 forms an output connection 31 for the detector circuit 62. An output circuit signal Y from the low-pass filter 28 is evaluated in a second amplitude evaluator 30 and the output of this amplitude evaluator 30 forms an output connection 32 of the detector circuit 62. The low-pass filters 27 and 28 as well as the amplitude evaluators 29 and 30 may be built in the same fashion as the device for the known method set forth above or by other known means as well.

By a suitable selection of the phase relationships and the frequency of the switch signals $U_A$, $U_B$, $U_C$ and $U_D$, the upper sideband or lower sideband of the pilot tone signal which has been amplitude modulated with the corresponding identifying tone can be interpreted. The information of the undesired sideband is at least partially compensated by addition of the mixer output signals that belong together. The information of the desired sideband is amplified and provided that the sideband has an especially favorable signal shape, it is doubled.

The frequency-phase relationships of the individual switch signals $U_A$, $U_B$, $U_C$ and $U_D$ for implementing the present method for detecting to the presence of the stereo identification frequency, wherein the video line frequency is used as a reference frequency from which switch signals in the form of amplitude modulated signals are generated and a carrier signal corresponding to the pilot tone frequency and their frequency of modulation corresponding to the frequency to be identified, can be derived from the following Table 1. Analogously, the frequency-phase relationships of the switch signals $U_{A'}$, $U_{B'}$, $U_{C'}$ and $U_{D'}$ for detection of the dual tone, or two channel, identification signal are also set forth. Signal shapes corresponding to the left-hand column of the Table 1 suppress the lower sideband of the pilot tone signal which is amplitude-modulated with the identification signal. This leads to the detection of the upper sideband signal. The right-hand column of the table 1 indicates the frequency-phase relationships of the switch signal which lead to detection of the lower sideband signal.

TABLE 1

| Switch Signal | Detection of the Upper Sideband | Detection of the Lower Sideband |
|---|---|---|
| $U_A$ | cos(omega$_p$ t) cos(omega$_s$ t) | cos(omega$_p$ t) cos(omega$_s$ t) |
| $U_B$ | −sin(omega$_p$ t) sin(omega$_s$ t) | sin(omega$_p$ t) sin(omega$_s$ t) |
| $U_C$ | sin(omega$_p$ t) cos(omega$_s$ t) | sin(omega$_p$ t) cos(omega$_s$ t) |
| $U_D$ | cos(omega$_p$ t) sin(omega$_s$ t) | −cos(omega$_p$ t) sin(omega$_s$ t) |
| $U_{A'}$ | cos(omega$_p$ t) cos(omega$_z$ t) | cos(omega$_p$ t) cos(omega$_z$ t) |
| $U_{B'}$ | −sin(omega$_p$ t) sin(omega$_z$ t) | sin(omega$_p$ t) sin(omega$_z$ t) |
| $U_{C'}$ | sin(omega$_p$ t) cos(omega$_z$ t) | sin(omega$_p$ t) cos(omega$_z$ t) |
| $U_{D'}$ | cos(omega$_p$ t) sin(omega$_z$ t) | −cos(omega$_p$ t) sin(omega$_z$ t) |

The operation of the circuit of the present invention shall be shown with reference to an input signal $U_1$ supplied to the mixers 55 and 56 as well as with reference to output signals $U_2$ and $U_3$ from these mixers 55 and 56. The output signals $U_2$ and $U_3$ derive on the basis of the switch signals $U_A$ and $U_B$ taken from the Table 1 above for the detection of the upper sideband signal. This example also is with reference to an output signal $U_4$ from the adder circuit 59.

Given that an upper sideband signal is to be detected, the following is valid according to the Table 1 for the switch signal $U_A$, with $x = \text{omega}_P t$ and $y = \text{omega}_S t$, whereby $\text{omega}_P$ is a radian pilot tone frequency, $\text{omega}_S$ is a radian frequency of a stereo identification signal, fi is an arbitrary pilot tone phase, and psi is an arbitrary identification signal phase:

$$U_A = \cos(x)\cos(y) = \tfrac{1}{2}(\cos(x-y) + \cos(x+y))$$

and, for the switch signal $U_B$:

$$U_B = -\sin(x)\sin(y) = -\tfrac{1}{2}(\cos(x-y) - \cos(x+y)).$$

Let an input signal $U_1$ be $$U_1 = A(1 + m\cos(y + \text{psi})\cos(x + fi))$$

or $$U_1 = A(\cos(x+fi) + m/2(\cos(x-y+fi-\text{psi}) + \cos(x+y+fi+\text{psi})))$$

The output signal $U_4$ from the adder circuit 59 is composed in the following way:

$$U_4 = U_A U_1 + U_B U_1$$

For the aforementioned conditions, the first product of this equation is:

$$U_A U_1 = A/4\,(\cos(y + fi) + \cos(2x - y + fi) +$$

$$\cos(y - fi) + \cos(2x + y + fi) + m/2\,(\cos(2y - fi - \text{psi}) +$$

$$\cos(2x + fi + \text{psi}) + \underline{\cos((x+y) - (x+y) - (fi + \text{psi}))} +$$

$$\cos(2x + 2y + fi + \text{psi}) +$$

$$\underline{\cos((x-y) - (x-y) + (\text{psi} - fi))} +$$

$$\cos(2x - 2y + fi + \text{psi}) + \cos(2y + \text{psi} + fi) +$$

$$\cos(2x + fi - \text{psi}))).$$

The two underlined terms each correspond to a DC voltage for the signal component in the input signal $U_1$ whose frequency corresponds to the sum of the pilot tone frequency and of the frequency of interest and to the DC voltage component for the signal component in $U_1$ whose frequency corresponds to the difference between the pilot tone frequency and the identification frequency. The height, or amplitude, of every DC voltage component in this case depends upon the phases fi and psi.

The product of signals $U_B$ and $U_1$ have the following form:

$$U_B U_1 = -A/4\,(\cos(y + fi) + \cos(2x - y + fi) -$$

$$\cos(2x + y + fi) - \cos(y - fi) + m/2(\cos(2y + fi + \text{psi}) +$$

$$\cos(2x + fi + \text{psi}) -$$

$$\underline{\cos((x+y) - (x+y) + (fi + \text{psi}))} + \cos(2x + 2y + fi + \text{psi}) +$$

$$\underline{\cos((x-y) - (x-y) + fi - \text{psi}))} + \cos(2x - 2y + fi - \text{psi}) -$$

$$\cos(2y - fi + \text{psi}) - \cos(2x + fi - \text{psi})))$$

In this equation, too, the underlined terms each correspond to a DC voltage component for the signal component in the input signal $U_1$ having the frequency of the sum of the pilot tone frequency and the identification frequency as well as the signal component having a frequency that is formed of the difference between the pilot tone frequency and the identification frequency.

It can be seen from the output signal $U_4$ of the adder circuit 59 that, in this example, the DC voltage components that are formed from the signal component corresponding to the cummulative frequency are added and the DC voltage components that are formed from the signal component corresponding to the differential frequency are subtracted from one another. When the switch signals for obtaining the upper sideband signal are selected from the Table 1, set forth above, then the DC voltage components of the cummulative frequency signals are subtracted from one another and the DC voltage components of the differential frequency signals are added.

The oscillatory terms appearing at the output of the adder circuit 59 are attenuated with the assistance of the low-pass filter 27 following the adder. Thus, a DC voltage signal X is largely exclusively present at the output of this low-pass filter 27. The presence of this DC voltage signal X is dependent upon the presence of the frequency to be detected in the input signal $U_1$ and is proportional to the amplitude A and to the degree of modulation m and is further dependent upon the phase angles fi and psi. Note that the DC voltage signal X is distinguished from the variable $x = \text{omega}_{pt}$.

To reliably detect the frequency to be identified, also referred to as the frequency of interest, a signal Y analogous to the signal X is generated in analogous fashion via the mixers 57 and 58 with suitable switch signals $U_C$ and $U_D$ and, subsequently, via the adder circuit 60 and the low-pass filter 28. The amplitude of the signal Y is dependent upon the phase additionally shifted by 90° relative to the phases fi and psi. Note that the DC voltage signal Y is distinguished from the variable $y = \text{omega}_s t$. Thus, when the signal X at the input of the amplitude evaluator 29 is proportional to the amplitude A, to the degree of modulation m, and to the cosine of a resultant phase, then the signal Y at the input of the amplitude evaluator 30 is proportional to the amplitude A, to the degree of modulation m, and to the sine of the resultant phase. Since the phase angles fi and psi can assume arbitrary values, both signals X and Y are simultaneously evaluated. The locus curve of these signals in a rectangular coordinate system is a circle around the origin whose radius is proportional to A and m. With respect to the input signal $U_1$, the detector circuit 62 or the detector circuit 62' acts as a band pass filter whose center frequency is defined by the selected frequency components, either the upper or lower sideband of the switch signal, and whose band width is equal to twice the low-pass filter cut-off frequency of the low-pass filter circuit 27 or 28, whereby the signals X or Y are proportional to a rectified output signal of such a low-pass filter.

The interpretation of the signals X and Y can be undertaken in a known fashion with amplitude evaluators, as set forth above.

Figure 6:
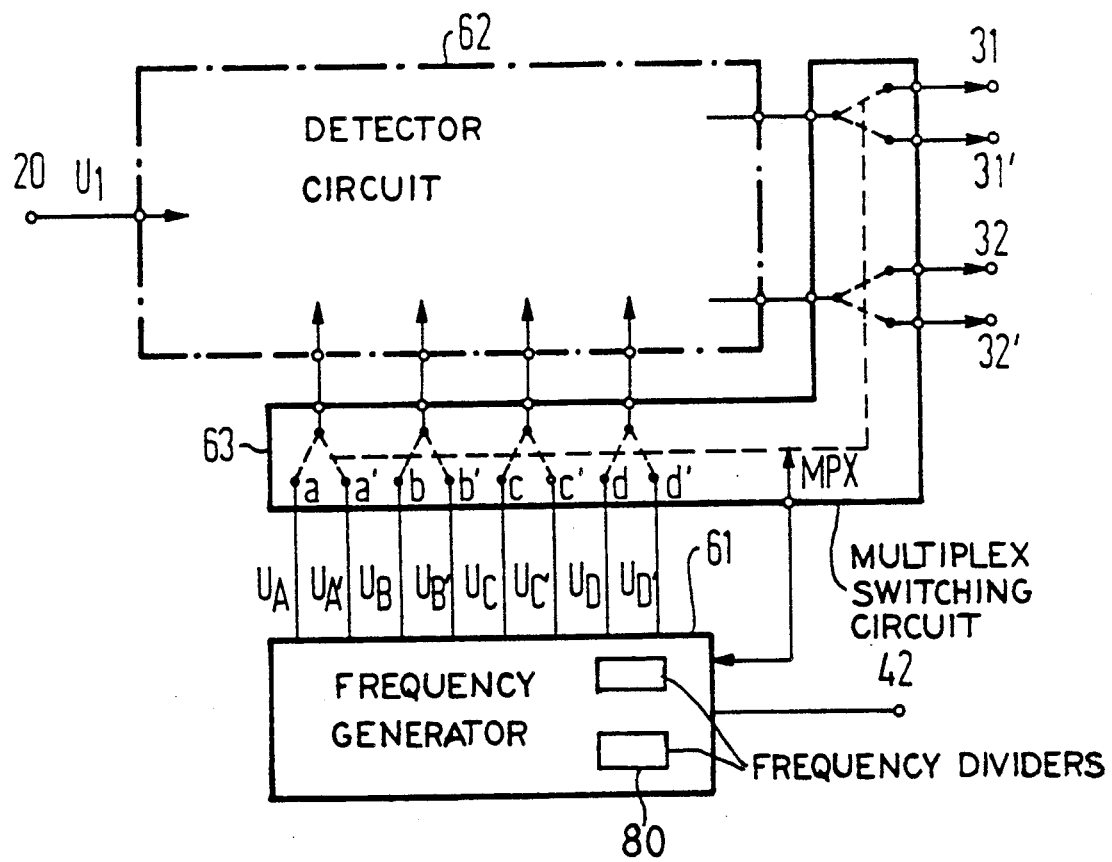
FIG. 6 is a block circuit diagram of a possible embodiment for identifying two different frequencies upon use of a detector circuit as well as a multiplex switchover means for common switching of the frequency generator output leads and of the signal outputs of the detector circuit.

FIG. 6 shows an arrangement for operation in a multiplex mode, as well be discussed hereinafter.

Figure 7:
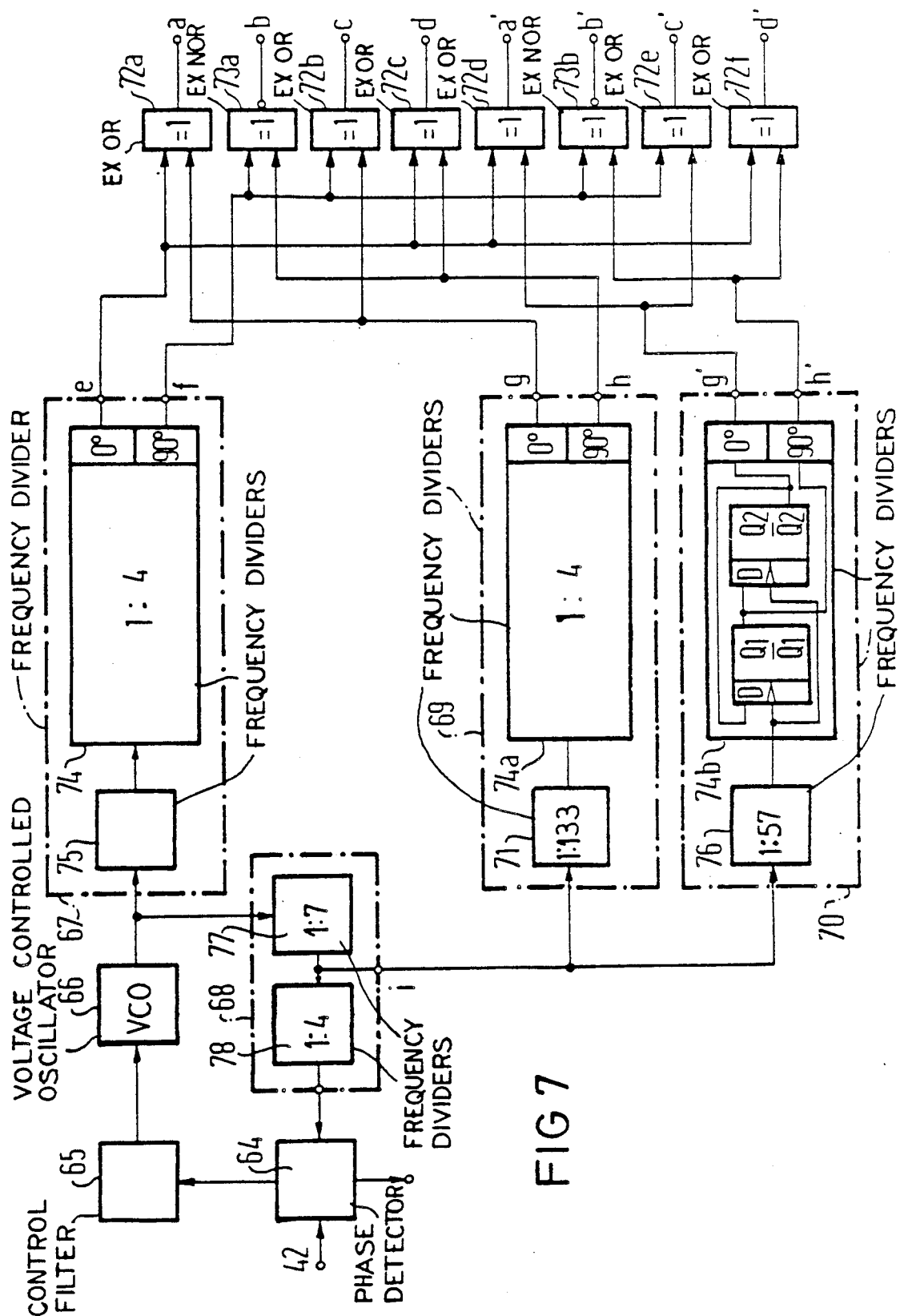
FIG. 7 is a block circuit diagram of a possible embodiment of a frequency generator, also for the case for detecting the presence of two frequencies that are modulated into the same carrier signal.

FIG. 7 shows an embodiment of frequency generator applying a phase locked loop frequency synthesis principle for the case where a pilot carrier frequency $f_p$ is a rational multiple TV 68/TV 67 of a reference frequency $f_h$ supplied at an input lead 42 and the reference frequency $f_h$ is whole multiple of the modulation frequencies $f_s$ and $f_z$. In this case TV 67 and TV 68 are rational numbers and, in particular, are division ratios of frequency dividers 67 and 68, respectively.

In detail, the frequency generator shown in FIG. 7 is composed of a phase control loop which includes a phase detector 64, a control filter 65 following thereupon which in particular is an integration filter, and a voltage controlled oscillator 66 following the control filter 65. The output of the voltage controlled oscillator 66 is conducted via a frequency divider 68 to a second signal input of the phase detector 64. The other input of the phase detector 64 receives signal via the input lead 42, the signal being a reference signal which is, for example, the horizontal sweep frequency $f_h$ of a television receiver.

When the relationship of the reference frequency $f_h$ to a demodulation frequency $f_s$ or $f_z$ is divisible by 4 without remainder, it is meaningful to execute, or construct, the frequency divider 68 as a series circuit of two frequency dividers 77 and 78. The individual frequencies to be edited are respectively required twice with a phase shift of 90°. Such a phase shift can be relatively easily realized with the assistance of frequency dividers having a division ratio of 1:4 and corresponding outputs.

An example of a simple frequency divider having two outputs that offer the same signal phase-shifted relative to one another is shown in detail in FIG. 7 in a frequency divider 74b. The frequency divider 74b is formed of series connected D flip-flop having the input signal connected to the clock inputs as shown. The same principles may be used to form the other frequency dividers in the present circuit.

A phase locked loop frequency that is higher than the reference frequencies supplied to the lead 42 by the factor of the division ration TV 68 of the divider 68 ca be conducted to the output of the voltage controlled oscillator 66. Via a frequency divider 67 having a broad band phase shifter, the output of the voltage controlled oscillator 66 is divided with a division ratio TV 67 and a signal provided as a carrier signal is offered with a phase difference of 90° at an output e and f of the frequency divider 67.

In two-channel television systems, TV 68/TV 67=3.5 is true for the ratio of the division ratio TV 68 of the frequency divider 68 to the division ration TV 67 of the frequency divider 67 when the horizontal sweep frequency $f_h$ is supplied to the lead 42 and when the pilot tone frequency $f_p$ amounts to 3.5 times the horizontal sweep frequency. Other multiples are possible in other television encoding systems.

The voltage control oscillator 66 output signal can also be provided as an input signal for further frequency dividers or frequency divider series circuits.

Likewise, an output signal of the frequency divider 68 can serve as basis for editing the other required signals. FIG. 7 shows a method which proves meaningful particularly for use of a 1:4 phase shifter frequency divider as an output stage. The frequency divider 68 is composed of a frequency divider 77 whose division ratio TV 77 is greater by a factor 4 than the required division ratio TV 68 and is composed of a frequency divider 78 having a division ratio TV 78 of 1:4 that follows the frequency divider 77 and whose output signal is provided for charging the above-described input of the phase detector 64.

An output signal i from the frequency divider 77 is connected to a signal input of a frequency divider 69. The frequency divider 69 has two outputs g and h from which the same signal with a phase shift of 90° relative to one another is output. For generating the switch signals that are intended to detect the stereo operating mode in a two-carrier television audio system, the frequency divider 77 has a division ration TV 77 of 1:7 in a favorable, preferred embodiment and the frequency divider 69 is composed of a 1:4 frequency divider 74a that is connected to the outputs g and h. The frequency divider 69 also has a frequency divider 71 having a division ratio TV 71 of 1:13 and which is connected between the frequency dividers 77 and 74a. A frequency divider 70 having output leads g' and h' is analogous to the frequency divider 69 and is required for generating switch signals for the detection of the dual-tone, or two channel, mode in a two-carrier television audio system. In this case, the frequency divider 70 differs from the frequency divider 69 only in terms of it's division ratio. When the frequency divider 70 is composed of a series circuit of a frequency divider 76 followed by a 1:4 frequency divider 74b, then the frequency divider 76 has a division ratio TV 76 of 1:57.

The 0° and 90° components of the generated signals are available with the assistance of the frequency dividers 74, 74a, and 74b which also function as broadband phase shifters. The corresponding switch signals $U_A$, $U_B$, $U_C$ and $U_D$ and, if required, $U_A'$, $U_B'$, $U_C'$ and $U_D'$ are generated by an exclusive-OR logic operation.

The signal output e is connected to an input of an Exclusive OR (EX OR) gate 72a, an input of an Exclusive OR gate 72c, and input of an Exclusive OR gate 72d, and an input of an Exclusive OR gate 72f. The signal output f is connected to an input of a Exclusive NOR (EX NOR) gate 73a an input of an Exclusive NOR gate 72b, an input of an Exclusive NOR gate 73b, and an input of an Exclusive OR gate 72e. The signal output g is connected to the other signal input of the Exclusive OR gate 72a and of the Exclusive OR gate 72b. The signal output f is respectively connected to the other input of the Exclusive NOR gate 73a and of the Exclusive OR gate 72c. The signal output g' is respectively connected to the other signal input of the Exclusive OR gate 72d and of the exclusive OR gate 72e. The signal output h' is respectively interconnected to the other signal input of the Exclusive NOR gate 73b and of the Exclusive OR gate 72f.

The output of the Exclusive OR gate 72a forms an output lead a of the frequency generator 61; the output of the exclusive NOR gate 73a forms the output lead b, that of the Exclusive OR gate 72b forms the output lead c, that of the Exclusive OR gate 72C forms the output lead d, that of the Exclusive OR gate 72d forms the output lead a', that of the Exclusive NOR gate 73b forms the output lead b', that of the Exclusive OR gate 72e forms the output lead c', and the output of the Exclusive OR gate 72f forms the output lead d' of the frequency generator 61.

The advantage of the present frequency generator is that the switch signals for both identification tones are generated in one phase locked loop (PLL) circuit and that a relatively high reference frequency serves as the comparison frequency for the phase detector. A further advantage of this embodiment an specifically as used in television sets is that the lock-in state of the phase locked loop circuit 64, 65, 66 and 68 can simultaneously serve as an indicator for the presence of the video line frequency and, thus, can be utilized as a coincidence or muting function.

Just one detector 62 whose input and output leads can be switched in multiplex mode using a multiplex switching circuit 63 is shown in FIG. 6 instead of two detector circuits being connected in parallel as in FIG. 5. Similarly, only one frequency divider 80 whose division ratio is correspondingly switchable can also be provided in the frequency generator instead of the two frequency dividers 69 and 70. In this way, a plurality of frequencies of interest may be determined to be either present or absent.

Thus, there is described and shown a method and circuit arrangement for identifying the presence or absence of known frequencies of interest in an input signal composed of a plurality of frequencies. A frequency generator controlled by a reference frequency generates four switch signals having frequencies dependent upon the frequency of interest and having a phase difference of 90° relative to one another. One of the four switch signals is mixed with the input signal in each of four mixers and the mixer product signals of pairs of mixers are added together and filtered to remove AC components. The DC voltage component is then evaluated in amplitude to determine the presence or absence of the frequency of interest.

Although the foregoing preferred embodiment has been described for use in the PAL Television system, the principles embodied therein are equally applicable to other types of television systems, such as the NTSC Television system. For example, the line frequency disclosed in the present application of 15,625 Hz in the PAL system corresponds to a line frequency of 15,734.3 Hz in the NTSC color system.

Although other modifications and changes may be suggested by those skilled in the art, it is the intention of the inventor to embody within the patent warranted hereon all changes and modifications as reasonably and properly come within the scope of his contribution to the art.

I claim:

1. A method for identifying presence or absence of a frequency of interest of a known value in an input signal composed of a plurality of frequencies, comprising the steps of:
   supplying the input signal to one input of each of four mixers;
   deriving four switch signals from a reference frequency, said four switch signals each being of a frequency substantially identical to said frequency of interest and having a fixed phase relationship;
   mixing said four switch signals with said input signal in each of said four mixers to produce mixer product signals;
   adding pairs of said mixer product signals to one another to suppress undesired sideband signal components and increase signal components of said frequency of interest, said adding step producing adding output signals having basic components at 90° phase angles relative to one another;
   filtering said adding output signals to substantially remove AC signal components; and
   amplitude evaluating DC voltage components of signals from said filtering step to determine the presence or absence of said frequency of interest.

2. A method as claimed in claim 1, wherein said frequency of interest is an identifier frequency modulated onto a pilot tone carrier of a two carrier television audio system, and further comprising the steps of:
   using a video line frequency as the reference frequency; and
   generating switch signals in the form of amplitude modulated signals from said reference frequency, the switch signals having a carrier frequency corresponding to the video line frequency and a frequency of modulation corresponding the identifier frequency.

3. A method as claimed in claim 1, further comprising the step of:
   filtering out AC components from the output signals from said mixers using a low-pass filter.

4. A method as claimed in claim 1, wherein said step of evaluating the amplitude includes:
   subjecting absolute values of DC components in the mixer product signals to a threshold determination given the presence of the frequency of interest.

5. A method as claimed in claim 1, wherein said step of evaluating the amplitude includes:
   subjecting a value of a square root of a sum of the squares of absolute values of the mixer product to a threshold determination.

6. A method as claimed in claim 1, further comprising the step of:
   identifying the presence or absence of a plurality of frequencies of known value in parallel channels, wherein said switch signals are of the frequency of interest.

7. A method as claimed in claim 1, further comprising the step of:
   identifying a plurality of frequencies using a multiplex mode by switching the switch signals to the frequencies of interest.

8. A circuit for identifying the presence or absence of a frequency of interest in an input signal, comprising:
   a frequency generator driven by a stable reference frequency to generate switch signals;
   four mixers coupled to an output of said frequency generator to receive the switch signals, said mixers each having an input for receiving the input signal and an input for receiving the switch signals;
   two addition circuits each having two inputs and an output, said inputs being connected to outputs of respective ones of said four mixers;
   two filters coupled to outputs of respective ones of said addition circuits to filter out AC components; and
   two amplitude evaluation units coupled to respective outputs of said two filters, said two amplitude evaluation units producing output signals which are characteristic of either the presence or absence of the frequency of interest.

9. A circuit arrangement as claimed in claim 8, wherein said frequency generator is a phase locked loop circuit.

10. A circuit arrangement as claimed in claim 9, wherein said phase locked loop circuit of said frequency generator has four signal outputs, two of said four signal outputs carrying signals of a same frequency but of a different phase, and said frequency generator also having logic gates with signal inputs connected to said four signal outputs of said phase locked loop circuit, said logic gates having outputs which form outputs of said frequency generator.

* * * * *